United States Patent
McDonald

(10) Patent No.: US 9,601,656 B1
(45) Date of Patent: Mar. 21, 2017

(54) METHOD OF MANUFACTURING LOW COST, HIGH EFFICIENCY LED

(71) Applicant: Silego Technology, Inc., Santa Clara, CA (US)

(72) Inventor: John Othniel McDonald, Mountain House, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 14/740,121

(22) Filed: Jun. 15, 2015

Related U.S. Application Data

(60) Provisional application No. 62/012,199, filed on Jun. 13, 2014.

(51) Int. Cl.
| | | |
|---|---|---|
| *H01L 33/00* | (2010.01) | |
| *H01L 33/40* | (2010.01) | |
| *H01L 33/38* | (2010.01) | |
| *H01L 33/62* | (2010.01) | |
| *H01L 33/08* | (2010.01) | |
| *H01L 33/52* | (2010.01) | |
| *H01L 33/50* | (2010.01) | |

(52) U.S. Cl.
CPC ........ *H01L 33/0095* (2013.01); *H01L 33/007* (2013.01); *H01L 33/0008* (2013.01); *H01L 33/08* (2013.01); *H01L 33/38* (2013.01); *H01L 33/405* (2013.01); *H01L 33/504* (2013.01); *H01L 33/52* (2013.01); *H01L 33/62* (2013.01); *H01L 2933/005* (2013.01); *H01L 2933/0016* (2013.01); *H01L 2933/0041* (2013.01); *H01L 2933/0066* (2013.01)

(58) Field of Classification Search
CPC ..... H01L 33/0095; H01L 33/52; H01L 33/08; H01L 33/62; H01L 33/405; H01L 33/38; H01L 33/0008; H01L 33/504; H01L 33/007; H01L 2933/0041; H01L 2933/0016; H01L 2933/0066; H01L 2933/005
See application file for complete search history.

(56) References Cited

U.S. PATENT DOCUMENTS

| | | | | |
|---|---|---|---|---|
| 3,930,912 A | * | 1/1976 | Wisbey | H01L 27/156 148/DIG. 150 |
| 3,931,631 A | * | 1/1976 | Groves | H01L 33/00 257/87 |
| 5,077,587 A | * | 12/1991 | Albergo | H01L 27/153 257/437 |
| 5,925,897 A | * | 7/1999 | Oberman | H01L 25/0753 257/103 |
| 6,299,056 B1 | * | 10/2001 | Oota | H01L 33/38 228/177 |

(Continued)

OTHER PUBLICATIONS

Houston et al., Transmission and Reflection of Gold SND Silver Films, 1928; J.O.S.A, & R.S.I, 16, pp. 174-176; Mar. 1928.*

(Continued)

*Primary Examiner* — Nikolay Yushin
(74) *Attorney, Agent, or Firm* — Van Pelt, Yi & James LLP

(57) ABSTRACT

A low cost, high efficiency light-emitting diode design is disclosed. In some embodiments, a p-n junction of a light-emitting diode is formed in an epitaxial layer grown on a substrate. Grinding the backside of an associated wafer after encapsulation not only opens a light path for the light emitting diode but removes most residual defects.

20 Claims, 8 Drawing Sheets

(56) References Cited

U.S. PATENT DOCUMENTS

| | | | | |
|---|---|---|---|---|
| 6,734,467 B2* | 5/2004 | Schlereth | ............... | H01L 33/08 |
| | | | | 257/100 |
| 6,770,960 B2* | 8/2004 | Oohata | .................. | H01L 24/24 |
| | | | | 257/103 |
| 6,903,381 B2* | 6/2005 | Lin | ..................... | H01L 33/0079 |
| | | | | 257/81 |
| 7,847,301 B2* | 12/2010 | Ives | ..................... | H01L 25/167 |
| | | | | 257/100 |
| 7,884,376 B2* | 2/2011 | Lu | ........................ | H01L 33/387 |
| | | | | 257/81 |
| 9,147,629 B2* | 9/2015 | Chen | .................... | H01L 23/544 |
| 2003/0160258 A1* | 8/2003 | Oohata | .................. | H01L 24/24 |
| | | | | 257/99 |
| 2014/0084429 A1* | 3/2014 | Chen | .................... | H01L 23/544 |
| | | | | 257/666 |

OTHER PUBLICATIONS

Kasap, "pn Junction Devices and Light Emitting Fiodes" @ http://www.kasap.usask.ca/samples/pnjunctiondevices.pdf, pp. 1-33, Apr. 30, 2006.*

* cited by examiner

US 9,601,656 B1

METHOD OF MANUFACTURING LOW COST, HIGH EFFICIENCY LED

CROSS REFERENCE TO OTHER APPLICATIONS

This application claims priority to U.S. Provisional Patent Application No. 62/012,199 entitled LOW COST WHITE LED filed Jun. 13, 2014 which is incorporated herein by reference for all purposes.

BACKGROUND OF THE INVENTION

A light-emitting diode (LED) is a semiconductor light source. Various semiconductor materials may be employed in the fabrication of LEDs. For example, gallium nitride (GaN) is a commonly used LED material.

Exceptional performance has been achieved by GaN on GaN LEDs. However, GaN is an expensive material, limiting the commercial viability of GaN on GaN LEDs. To reduce costs, LEDs are instead frequently fabricated with cheaper substrate materials. For example, GaN on silicon (Si) LEDs are more common. However, such devices typically suffer from technical shortcomings arising from defects or cracks resulting from differences in thermal expansion by the two materials. The defects ultimately manifest as a decrease in efficiency, i.e., the conversion of electric current into light.

Thus, there exists a need for an improved LED design that overcomes the aforementioned cost and efficiency shortcomings of existing designs.

BRIEF DESCRIPTION OF THE DRAWINGS

Various embodiments of the invention are disclosed in the following detailed description and the accompanying drawings.

DETAILED DESCRIPTION

Figure 1A:
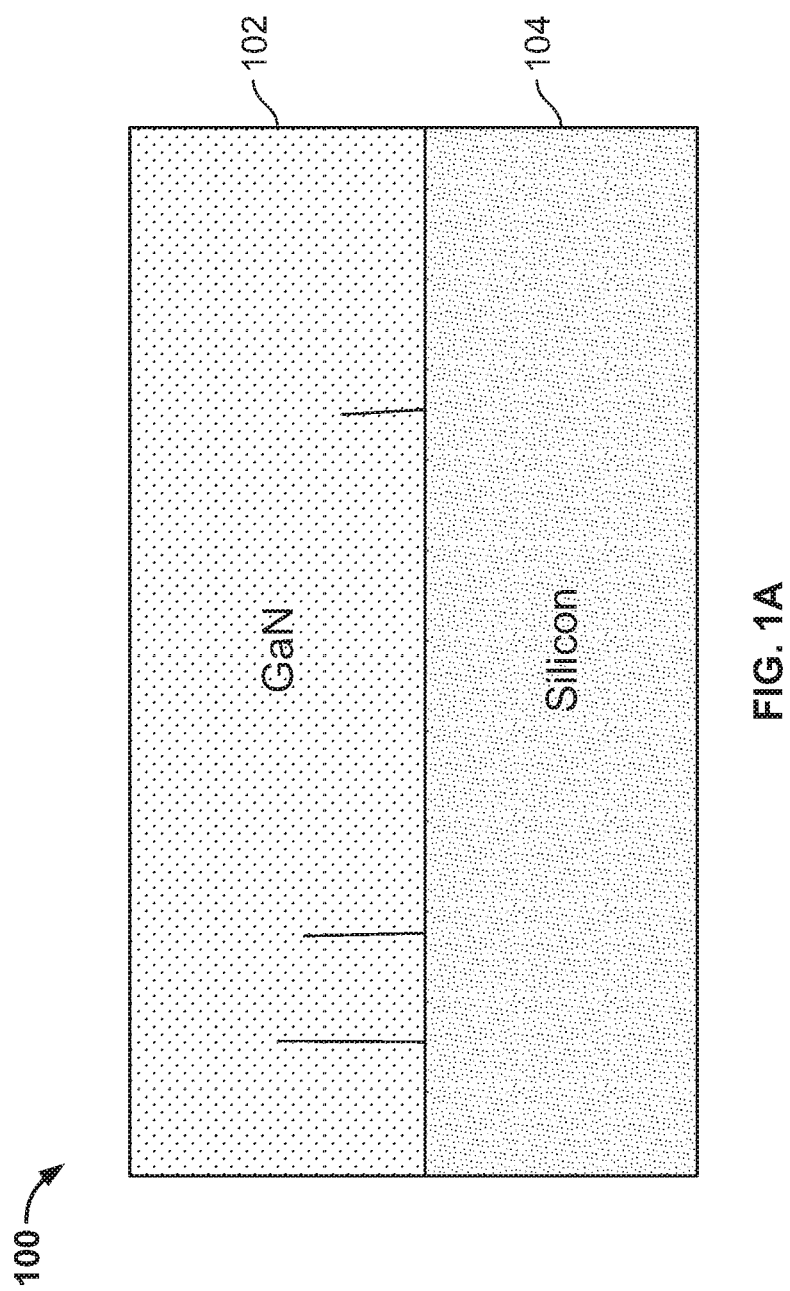
FIG. 1A illustrates a starting wafer.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Various light-emitting diode (LED) fabrication techniques that result in low cost and high efficiency devices are disclosed herein. Low cost is at least in part achieved by employing a more economical substrate material. High efficiency is at least in part achieved by ultimately removing the substrate to mostly, if not completely, remove residual defects or cracks near the substrate interface. The disclosed fabrication process results in a unique arrayed p-n junction architecture that may be fabricated via an entirely batch process using standard semiconductor processing techniques.

FIGS. 1A-1H illustrate an embodiment of a semiconductor process for fabricating one or more light-emitting diodes. In the given example, only high level semiconductor process steps are illustrated and described to explain the disclosed fabrication techniques. Thus, a complete semiconductor process may include other appropriate steps that are commonly used. Furthermore, one or more key steps of the disclosed fabrication process may be employed with other semiconductor process flows as applicable. In FIGS. 1A-1H, semiconductor process steps are described with respect to gallium nitride (GaN) on silicon (Si) devices for the purpose of example. The disclosed techniques, however, are not limited to the aforementioned materials but, rather, may generally be employed for LED fabrication using any appropriate semiconductor materials and combinations.

FIG. 1A illustrates a starting wafer 100 comprising an epitaxial layer 102 grown on a substrate 104. In the given example, GaN is grown on a silicon substrate. In other embodiments, any other appropriate epitaxial material (e.g., GaN, AN, GaAlxN, GaInxN, GaAs, etc.) and base/substrate material (e.g., GaN, silicon, sapphire, etc.) combination may be employed. As depicted in FIG. 1A, defects or cracks exist near the Si—GaN interface. A thick enough layer of GaN is grown on the silicon substrate so that the top side of the GaN layer is sufficiently far away from the high defect area near the silicon GaN interface so that few, if any, imperfections exist in this portion of the GaN layer.

Figure 1B:
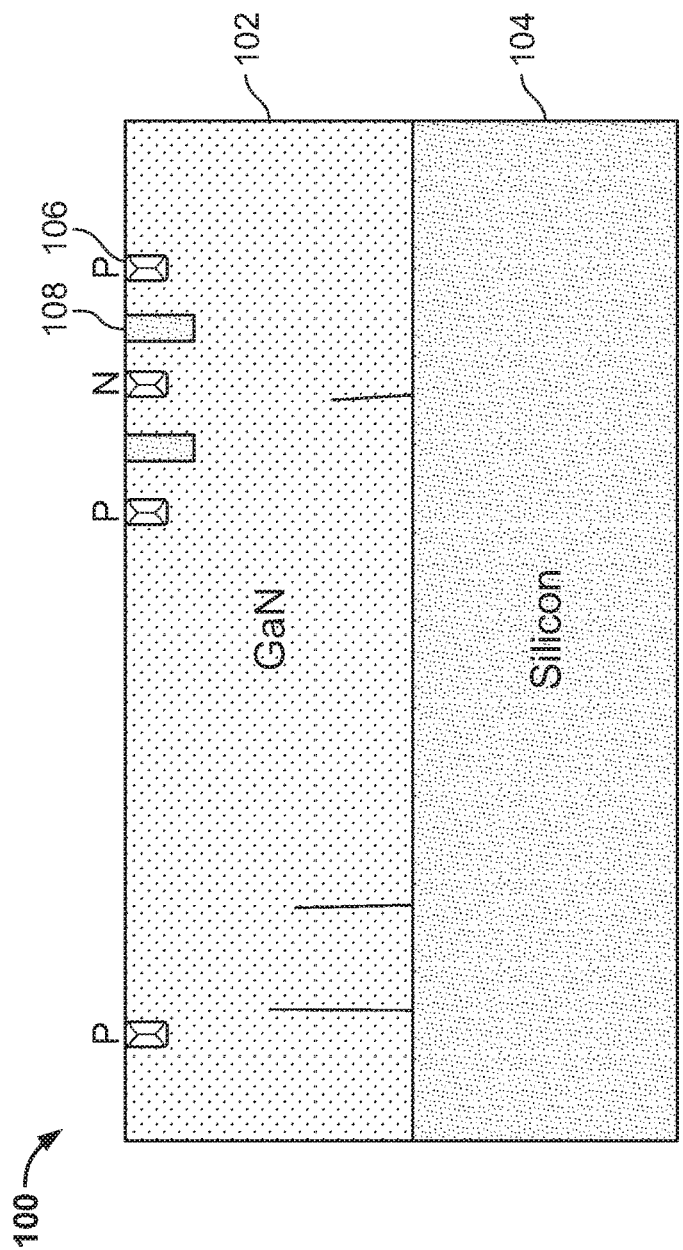
FIG. 1B illustrates adding doped regions to the wafer.

FIG. 1B illustrates adding doped regions to the top surface of wafer 100. In various embodiments, p-type and/or n-type doped regions may be added. In some cases, the size of the doped regions is minimized. In the example of FIG. 1B, p-type doped regions, such as p-type doped region 106, are added to the wafer. In this example, the wafer itself may be n-type doped, and/or n-type doped contacts may be applied. The goal of doping is to produce an optimally or appropriately sized diffusion region, such as diffusion region 108, between p-type and n-type regions. Light emission occurs in the diffusion region between p-type and n-type regions, which form a p-n junction. In various embodiments, diffusion regions may be designed to be dispersed or concentrated, narrow or wide, etc., depending on desired device characteristics. A unique aspect of this design is that the p-type region (anode) and the n-type region (cathode) of the p-n junction comprising a light-emitting diode are both situated at the top of the circuit in the same layer as depicted in FIG. 1B.

Figure 1C:
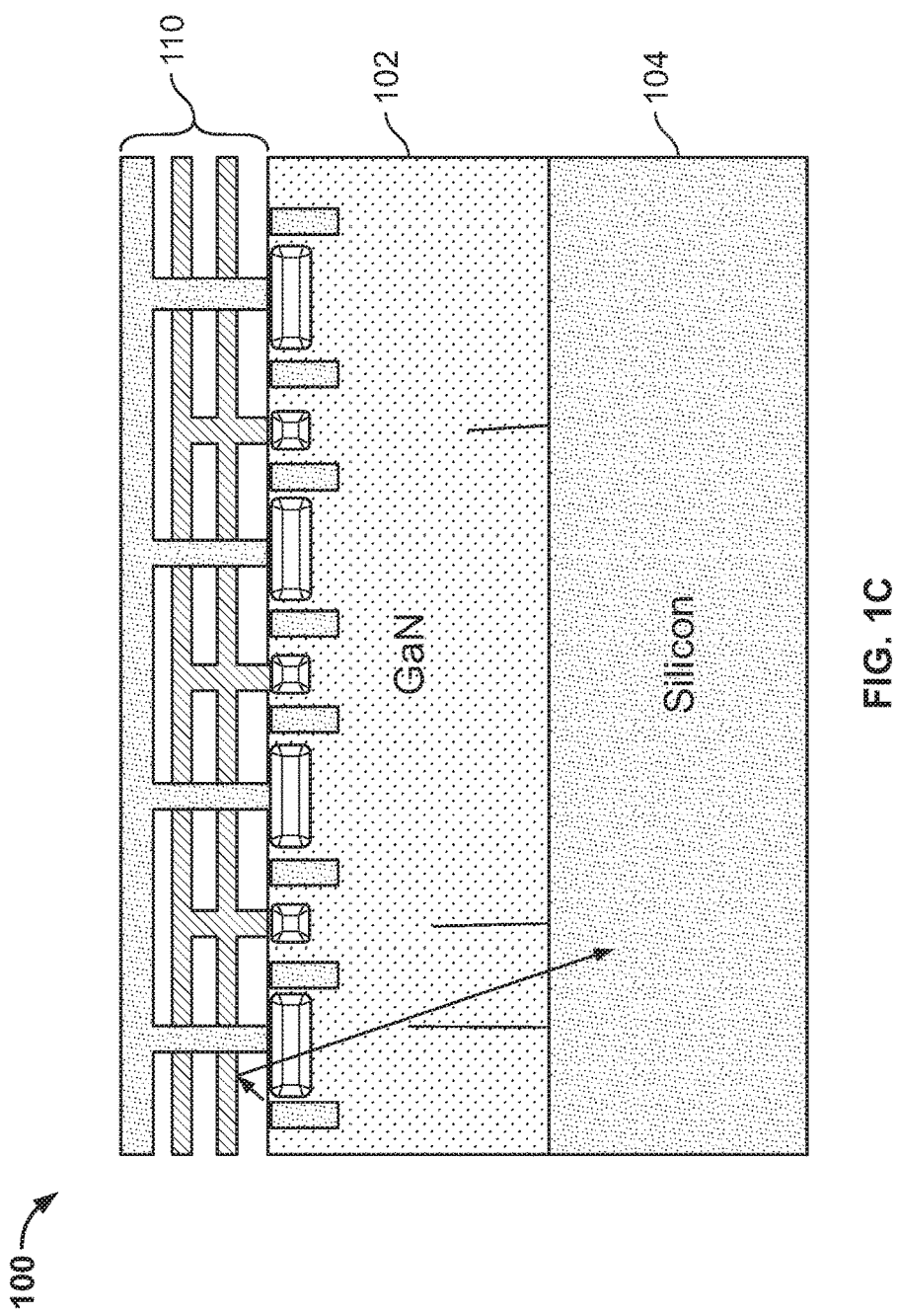
FIG. 1C illustrates adding metal layers.
Figure 1D:
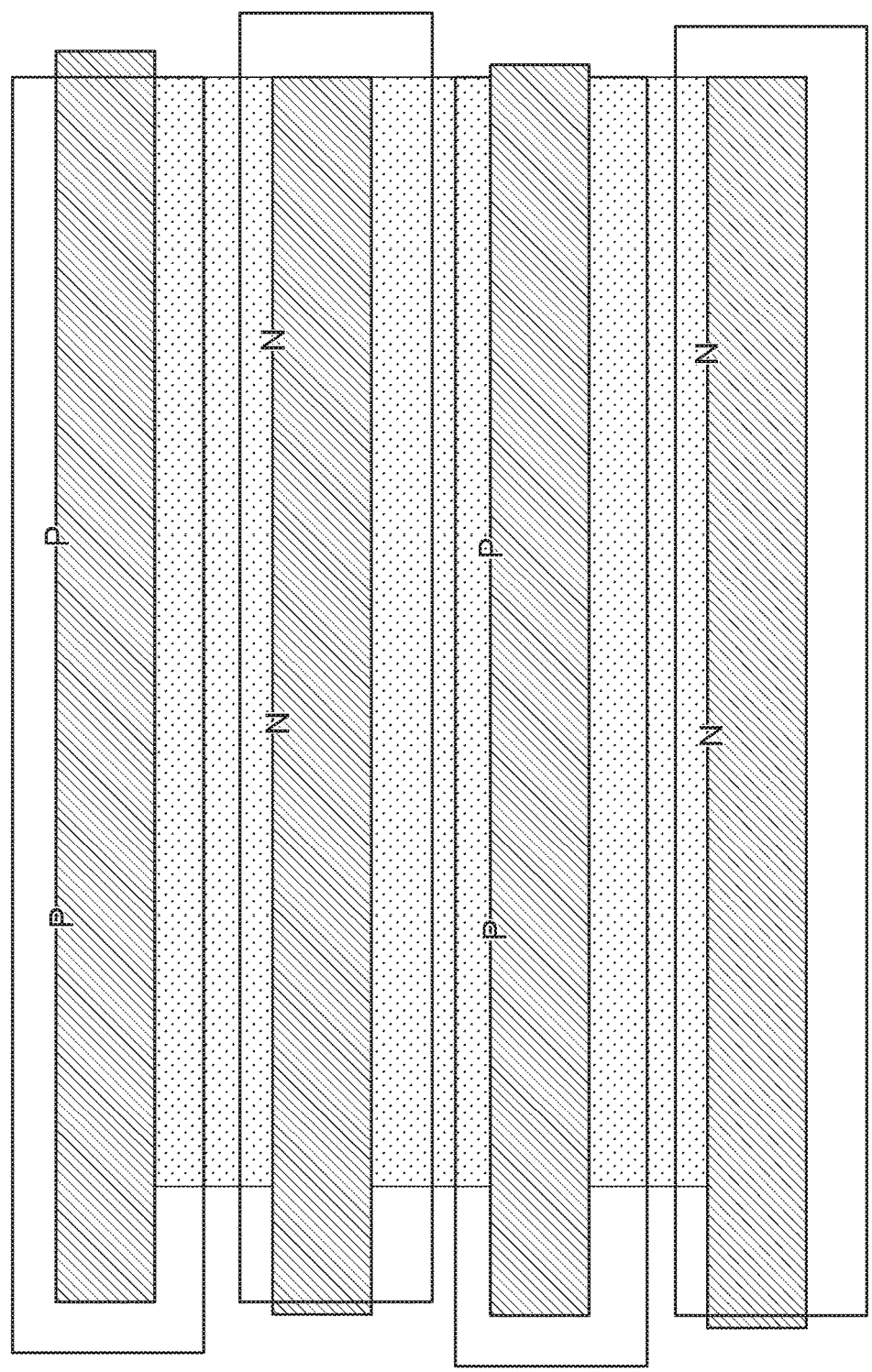
FIG. 1D illustrates a top view of metal layers.

FIG. 1C illustrates adding metal connectors and/or layers 110. The metal layers connect n-type and p-type contacts. In addition to providing electrical connectivity, the metal layers also function as reflectors or mirrors for incident photons. That is, emitted photons traveling away from the GaN layer reflect off of the metal and bounce back into and through the GaN layer. An example of photon travel is represented by the arrows in FIG. 1C. Thus, in the disclosed light-emitting diode architecture, both p-type and n-type metal contacts of a p-n junction function as photonic reflectors. Moreover, as depicted in FIG. 1C, an array of p-type and n-type metal contacts may be used as photonic reflectors. Any high efficiency (i.e., highly reflective) metal material may be employed such as aluminum, copper, etc. In some cases, one or more lower (bottom) metal layers may be made thicker than higher (top) metal layers to be better reflectors since the lower layers provide the most reflection, e.g., because most photons hit and are reflected back from the lower metal layers and never even reach higher layers. FIG. 1D illustrates a top view of metal layers having different thickness, i.e., in which a lower layer is made thicker to provide better reflection.

Figure 1E:
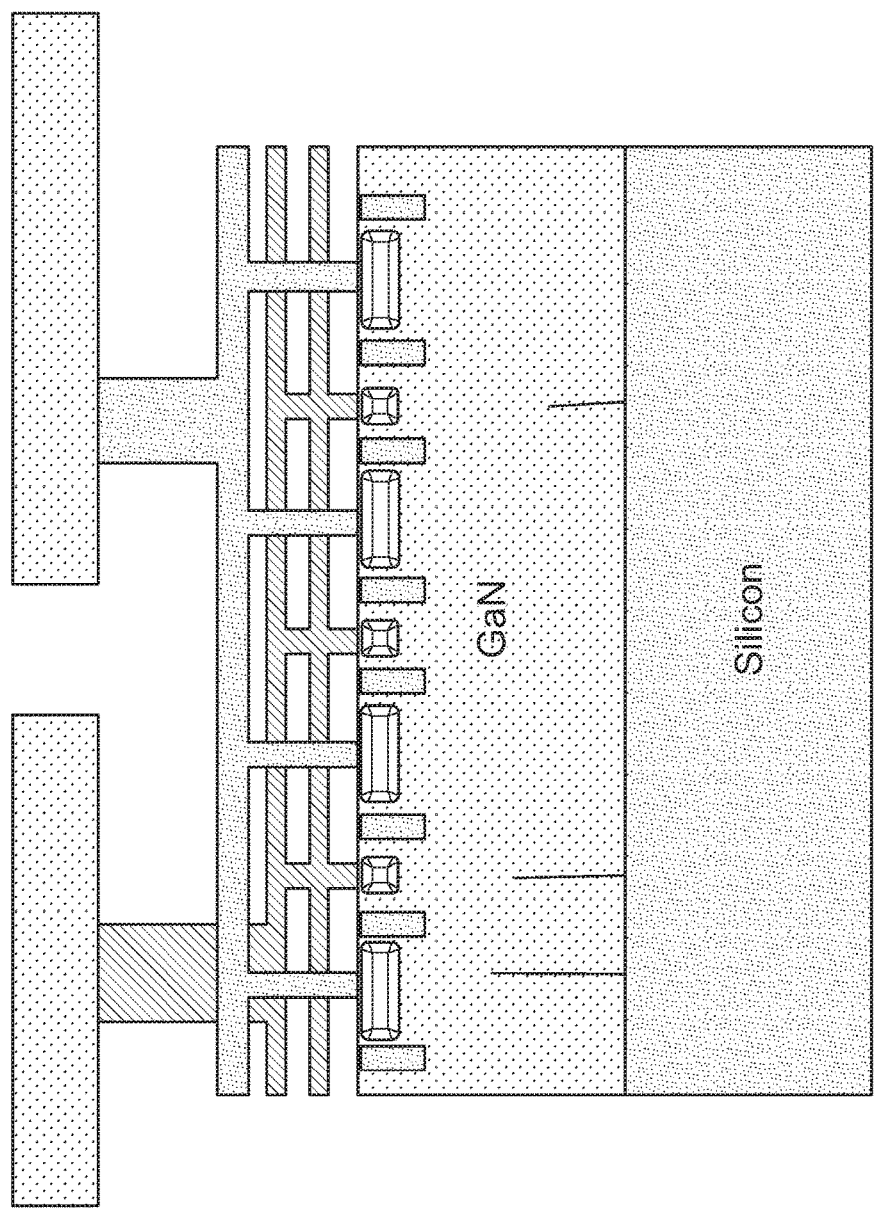
FIG. 1E illustrates adding pillars or bumps and attaching to a lead frame.
Figure 1F:
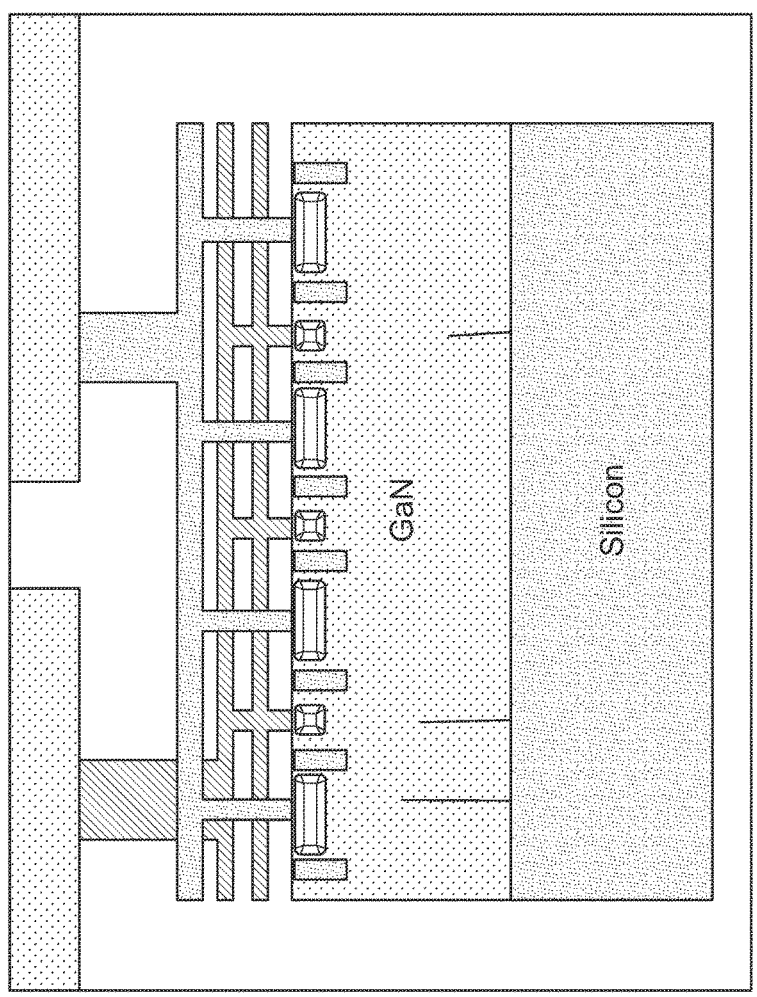
FIG. 1F illustrates encapsulating in a semiconductor package.

FIG. 1E illustrates adding (copper) pillars or bumps to the metal layers and attaching to a lead frame. FIG. 1F illustrates overmolding or encapsulating the device in a semiconductor package. Any suitable and/or standard semiconductor packaging technology may be employed, such as a quad-flat no-leads (QFN) package. Moreover, the device may be encapsulated as part of a batch process, i.e., without singulation from an associated batch. During this step, plastic encapsulates the light emitting portion of the device.

Figure 1G:
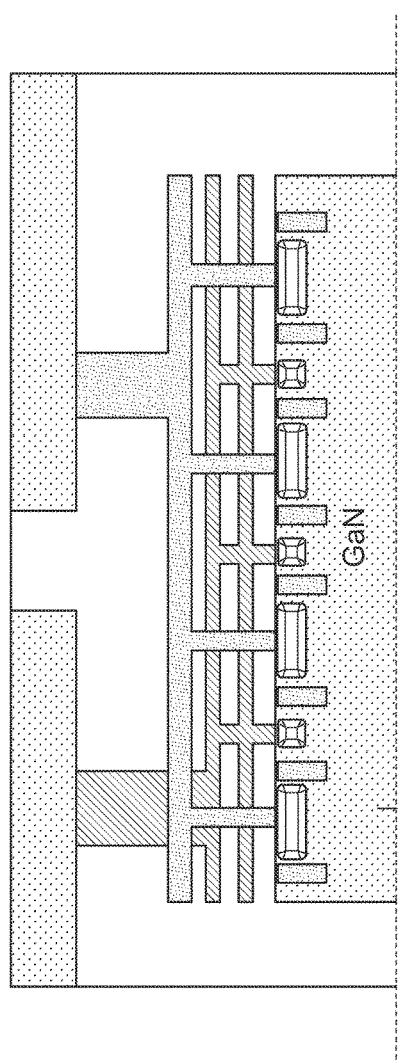
FIG. 1G illustrates grinding the backside to open a light path.

FIG. 1G illustrates grinding the backside of the wafer. As depicted, the silicon substrate is entirely (or, in some cases, partially) removed or stripped off during backgrinding. A portion of the GaN layer may also be removed or stripped off during backgrinding to remove most, if not all, defects. Thus, wafer grinding is employed to open a light path and remove most defects, ideally baring pure GaN. Instead of coming out through the top-side of the wafer, light comes out from the bottom-side. The die is subsequently flipped over for remaining processing steps.

Figure 1H:
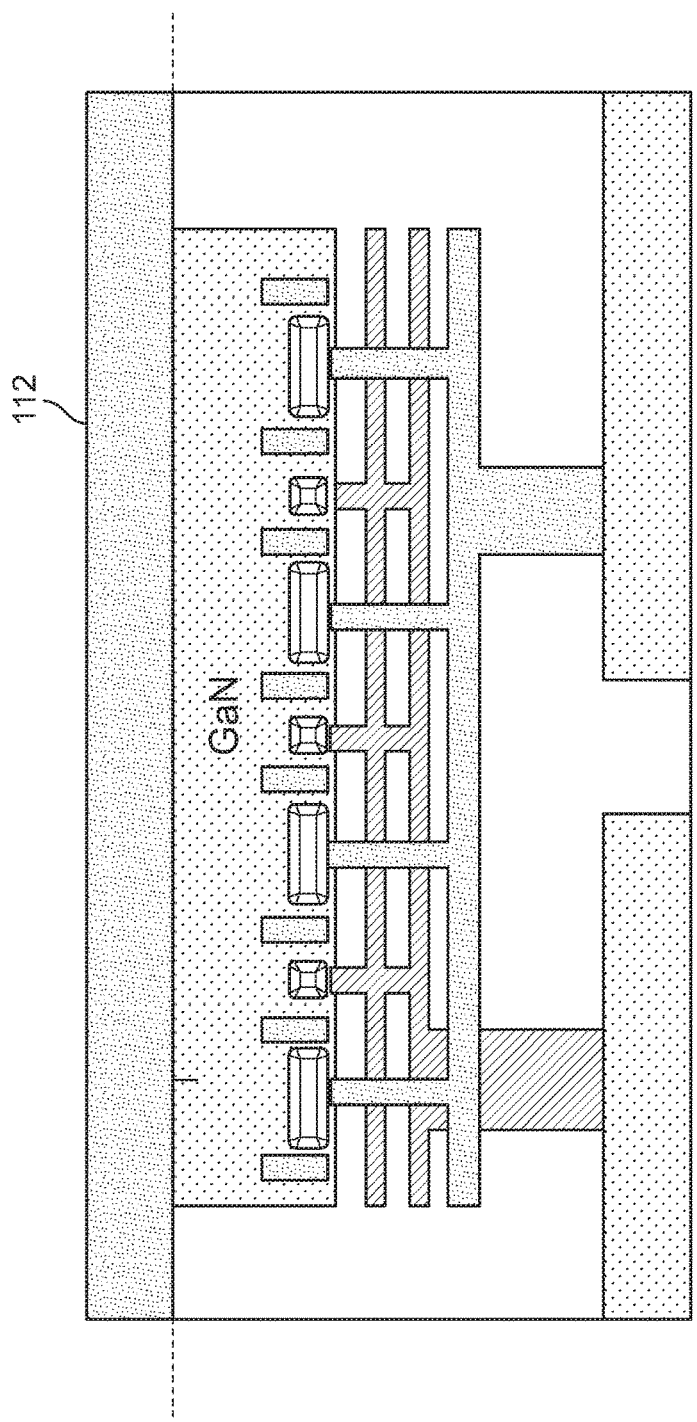
FIG. 1H illustrates adding a layer as a covering.

FIG. 1H illustrates adding a layer 112 over the portion exposed via backgrinding and through which light is emitted. Layer 112, for example, may comprise a simple phosphor film coating. Alternatively, layer 112 may comprise a polymer/plastic overlay film that is embedded with phosphor and/or that has phosphor on the top side of the film. The phosphor of layer 112 may be appropriately patterned to output different colors of light.

As described, the disclosed light-emitting diode design provides many advantages including low cost, high efficiency, and very small form factor and may be designed to output light of any color such as bright white or (RGB) colored light. Moreover, the disclosed techniques may be employed to fabricate not just one but a plurality of light-emitting diodes, e.g., arranged in an array. Such an array and an appropriately patterned phosphor layer may be employed, for example, to build a high efficiency, high definition color display. Furthermore, a single die may be fabricated to include one or more light-emitting diodes interspersed with other electronic circuits since batch processing using standard semiconductor fabrication techniques is possible. That is, other electronics may be integrated with light-emitting diodes.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   adding doped regions to a top side of an epitaxial layer grown on a substrate that form one or more p-n junctions comprising one or more light-emitting diodes, wherein an anode and a cathode of each light-emitting diode are both situated in the same layer; and
   opening a light path for the one or more light-emitting diodes by backgrinding to at least remove the substrate, wherein light is emitted from a bottom side of the epitaxial layer.

2. The method of claim 1, wherein backgrinding removes a portion of the epitaxial layer.

3. The method of claim 1, wherein backgrinding removes defects near an interface of the substrate and the epitaxial layer.

4. The method of claim 1, wherein the emitted light comprises white or colored light.

5. The method of claim 1, wherein light emission occurs from a diffusion region between p-type and n-type regions comprising each p-n junction.

6. The method of claim 1, further comprising adding a plurality of metal layers over the doped side of the epitaxial layer.

7. The method of claim 1, further comprising adding metal connectors comprising a plurality of metal layers that provide electrical connectivity and are reflectors for incident photons.

8. The method of claim 6, wherein a lower metal layer that is closer to the epitaxial layer is thicker than a higher metal layer.

9. The method of claim 6, further comprising adding pillars or bumps to the metal layers and attaching to a lead frame.

10. The method of claim 1, wherein both p-type and n-type metal contacts of a p-n junction comprising each light-emitting diode comprise photonic reflectors.

11. The method of claim 1, wherein an array of p-type and n-type metal contacts corresponding to an array of p-n junctions comprise photonic reflectors.

12. The method of claim 1, further comprising overmolding or encapsulating in a semiconductor package.

13. The method of claim 12, wherein the package comprises a quad-flat no-leads (QFN) package.

14. The method of claim 12, wherein encapsulating encapsulates the light emitting portions of the one or more light emitting diodes and backgrinding removes at least a portion of the encapsulant before reaching and removing the substrate.

15. The method of claim 1, further comprising adding a phosphor layer over a portion exposed from backgrinding.

16. The method of claim 15, wherein the phosphor layer comprises a plastic overlay film with embedded or layered phosphor.

17. The method of claim 15, wherein the phosphor is patterned to output one or more colors of light.

18. The method of claim 1, wherein the one or more light-emitting diodes are fabricated via an entirely batch process using standard semiconductor processing techniques.

19. The method of claim 1, further comprising integrating one or more other electronic devices with the one or more light-emitting diodes.

20. The method of claim 1, wherein the one or more light emitting diodes are arranged in an array to form a display.

* * * * *